(12) United States Patent
Leslie et al.

(10) Patent No.: US 11,527,508 B2
(45) Date of Patent: Dec. 13, 2022

(54) APPARATUSES AND METHODS FOR COUPLING A PLURALITY OF SEMICONDUCTOR DEVICES

(71) Applicant: MICRON TECHNOLOGY, INC., Boise, ID (US)

(72) Inventors: Matthew B. Leslie, Boise, ID (US); Timothy M. Hollis, Boise, ID (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/174,177

(22) Filed: Feb. 11, 2021

(65) Prior Publication Data

US 2021/0280557 A1 Sep. 9, 2021

Related U.S. Application Data

(60) Provisional application No. 62/984,738, filed on Mar. 3, 2020.

(51) Int. Cl.
*H01L 25/065* (2006.01)
*H01L 25/00* (2006.01)

(52) U.S. Cl.
CPC ........ *H01L 25/0652* (2013.01); *H01L 25/50* (2013.01); *H01L 2225/06506* (2013.01); *H01L 2225/06562* (2013.01)

(58) Field of Classification Search
CPC .............................................. H01L 2225/06562
See application file for complete search history.

(56) References Cited

U.S. PATENT DOCUMENTS 11,222,872 B2 * 1/2022 Lee .................. H01L 23/585
2021/0104479 A1 * 4/2021 Park ................. H01L 24/48

* cited by examiner

*Primary Examiner* — Yu-Hsi D Sun
(74) *Attorney, Agent, or Firm* — Dorsey & Whitney LLP

(57) ABSTRACT

Apparatuses and methods for coupling semiconductor devices are disclosed. Terminals (e.g., die pads) of a plurality of semiconductor devices may be coupled in a daisy chain manner through conductive structures that couple one or more terminals of a semiconductor device to two conductive bond pads. The conductive structures may be included in a redistribution layer (RDL) structure. The RDL structure may have a "U" shape in some embodiments of the disclosure. Each end of the "U" shape may be coupled to a respective one of the two conductive bond pads, and the terminal of the semiconductor device may be coupled to the RDL structure. The conductive bond pads of a semiconductor device may be coupled to conductive bond pads of other semiconductor devices by conductors (e.g., bond wires). As a result, the terminals of the semiconductor devices may be coupled in a daisy chain manner through the RDL structures, conductive bond pads, and conductors.

18 Claims, 7 Drawing Sheets

APPARATUSES AND METHODS FOR COUPLING A PLURALITY OF SEMICONDUCTOR DEVICES

CROSS-REFERENCE TO RELATED APPLICATION

This application claims the filing benefit of U.S. Provisional Application No. 62/984,738, filed Mar. 3, 2020. This application is incorporated by reference herein in its entirety and for all purposes.

BACKGROUND

In recent years, three-dimensional (3D) memory devices have been introduced. Some 3D memory devices are formed by stacking die vertically and coupling the die using through-silicon (or through-substrate) vias (TSVs) and/or wire bonds. Thus, 3D memory may also be referred to as "stacked memory." 3D memory may provide greater memory capacity and/or higher bandwidth with less increase in area than non-3D memory. Example 3D memory devices include Hybrid Memory Cube (HMC), High Bandwidth Memory (HBM), and Master-Slave Memory (MSM), each of which may include multiple dynamic random access memory (DRAM) die coupled to one another in a stack.

The memory device may be coupled to an external circuit that provides command, address, and data signals to the stacked die to access the memory. The stacked dies are typically coupled the external circuit in a parallel manner. As a result, in providing the signals to the stacked die, the external circuit drives the signals against a load of all the die, which may be significant. The heavy load presented by the stacked die may degrade signal integrity (S), which can cause data to be latched improperly at a receiver, and/or result in increased power consumption. In some applications, the decreased SI and increased power may unacceptable.

DETAILED DESCRIPTION

Apparatuses and methods for coupling semiconductor devices are disclosed. Terminals of a plurality of semiconductor devices may be coupled in a daisy chain manner through conductive structures that couple one or more terminals of a semiconductor device to two conductive bond pads. The terminals may be die pads of the semiconductor devices. The conductive structures may be included in a redistribution layer (RDL) structure. The RDL structure may have a "U" shape in some embodiments of the disclosure. Each end of the "U" shape may be coupled to a respective one of the two conductive bond pads, and the terminal of the semiconductor device may be coupled to the RDL structure. The conductive bond pads of a semiconductor device may be coupled to conductive bond pads of other semiconductor devices by conductors, such as bond wires. As a result, the terminals of the semiconductor devices may be coupled in a daisy chain manner through the RDL structures, conductive bond pads, and conductors.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessarily mutually exclusive, as some disclosed embodiments can be combined with one or more other disclosed embodiments to form new embodiments.

Figure 1:
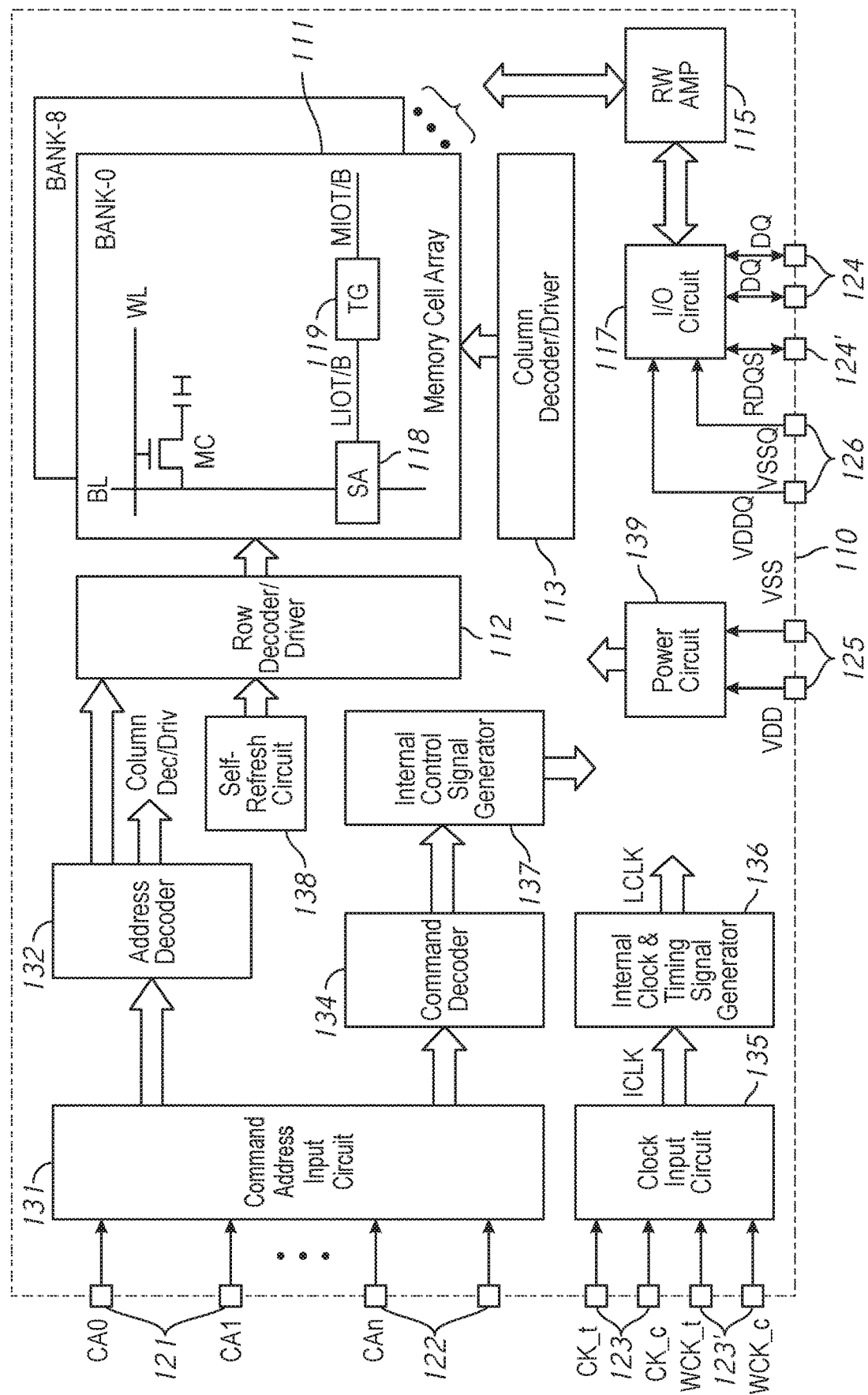
FIG. 1 is a block diagram of a semiconductor device in accordance with an embodiment of the present disclosure.

FIG. 1 is a block diagram of a semiconductor device 110 in accordance with an embodiment of the present disclosure. The semiconductor device 110 may be a memory integrated into a single semiconductor chip (e.g., a semiconductor die) in some embodiments, for example. Example memories may include volatile memory, such as dynamic random access memories (DRAMs) and static random access memories (SRAMs), and non-volatile memories, such as flash memory, resistive memories, and ferroelectric memories or any combination of the above.

The semiconductor device 10 includes a memory cell array 111. The memory cell array 111 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder/driver 112 and the selection of the bit line BL is performed by a column decoder/driver 113. Sense amplifiers 118 are coupled to corresponding bit lines BL and connected to local I/O line pairs LIOT/B. Local 10 line pairs LIOT/B are connected to main IO line pairs MIOT/B via transfer gates TG 119 which function as switches.

The semiconductor device 110 includes a plurality of terminals. In some embodiments of the disclosure, the terminals may be die pads. The plurality of terminals includes command and address terminals 121, clock terminals 123 and 123', data terminals 124, a data strobe terminal 124', power supply terminals 125 and 126. The data terminals 124 may be coupled to output buffers of an input/output circuit 117 for read operations. Alternatively, the data terminals 124 may be coupled to input buffers of the input/output circuit 117 for write access of the memories responsive to a data strobe signal DQS provided at the data strobe terminal 124'.

The command and address terminals 121 are supplied with the command and address signals CA, which include commands and memory addresses. The addresses provided to the command and address terminals 121 are transferred via a command and address input circuit 131 to an address decoder 132. The address decoder 132 receives the addresses and supplies a decoded row address to the row decoder/driver 112, and a decoded column address to the column decoder/driver 113. The address decoder 132 also receives a bank address and provides the bank address to the row decoder/driver 112 and/or the column decoder/driver 113. In a self-refresh mode, a self-refresh circuit 138 may provide a row address to the row/decoder driver 112 for self-refresh operation.

Commands provided to the command and address terminals 121 are provided to a command decoder 134 via the command and address input circuit 131. The command decoder 134 decodes the commands and provides the decoded commands to an internal control signal generator 137. The internal control signal generator 137 may generate various internal command signals responsive to the decoded commands from the command decoder 134. For example, the internal commands may include a row command signal to select a word line and a column command signal, such as a read command or a write command, to select a bit line.

Accordingly, when an activation command is issued and a row address is timely supplied with the activation command, and a column address is timely supplied with a read command, read data is read from a memory cell MC in the memory cell array 111 designated by the row address and column address. The read data DQ is output from the data terminals 124 via a read/write amplifier 115 and an input/output circuit 117. Similarly, when an activation command is issued and a row address is timely supplied with the activation command, and a column address is timely supplied with a write command, write data DQ supplied to the data terminals 124 is supplied via the input/output circuit 117 and the read/write amplifier 115 to the memory cell array 111 and written in the memory cell MC designated by the row address and the column address.

The clock terminals 123 are supplied with clock signals CK_t and CK_c, respectively, and clock terminal 123' are supplied with data clock signals WCK_t and WCK_c. The clock input circuit 135 receives the clock signals CK_t and CK_c and WCK_t and WCK_c and generates internal clock signals ICLK. The internal clock signals ICLK may include internal clock signals based on the clock signals CK_t and CK_c and/or internal clock signals based on the data clock signals WCK_t and WCK_c. Some or all of the internal clock signals ICLK are supplied to an internal clock and timing generator 136, which generates phase controlled internal clock signals LCLK in response. Although not limited thereto, the internal clock and timing generator 136 may include a DLL circuit. The phase controlled internal clock signals LCLK may be supplied to the input/output circuit 117 and used for timing the input and/or output of data. The internal clock and timing generator 136 may further generate various other internal clock signals for various memory operations.

The power supply terminals 125 are supplied with power supply potentials VDD and VSS. These power supply potentials VDD and VSS are supplied to a power circuit 139. The power circuit 139 may generate various internal potentials, for example, VPP, VOD, VARY, VPERI, and the like. The internal potential VPP is mainly used in the row decoder/driver 112, the internal potentials VOD and VARY are mainly used in the sense amplifiers 118 included in the memory cell array 111, and the internal potential VPERI is used in many other circuit blocks. The power supply terminals 126 are supplied with power supply potentials VDDQ and VSSQ. These power supply potentials VDDQ and VSSQ are supplied to the input/output circuit 117. The power supply potentials VDDQ and VSSQ may be the same potentials as the power supply potentials VDD and VSS that are supplied to the power supply terminals 125, respectively. However, the power supply potentials VDDQ and VSSQ may be used for the input/output circuit 117 so that power supply noise generated by the input/output circuit 117 does not propagate to the other circuit blocks.

Figure 2:
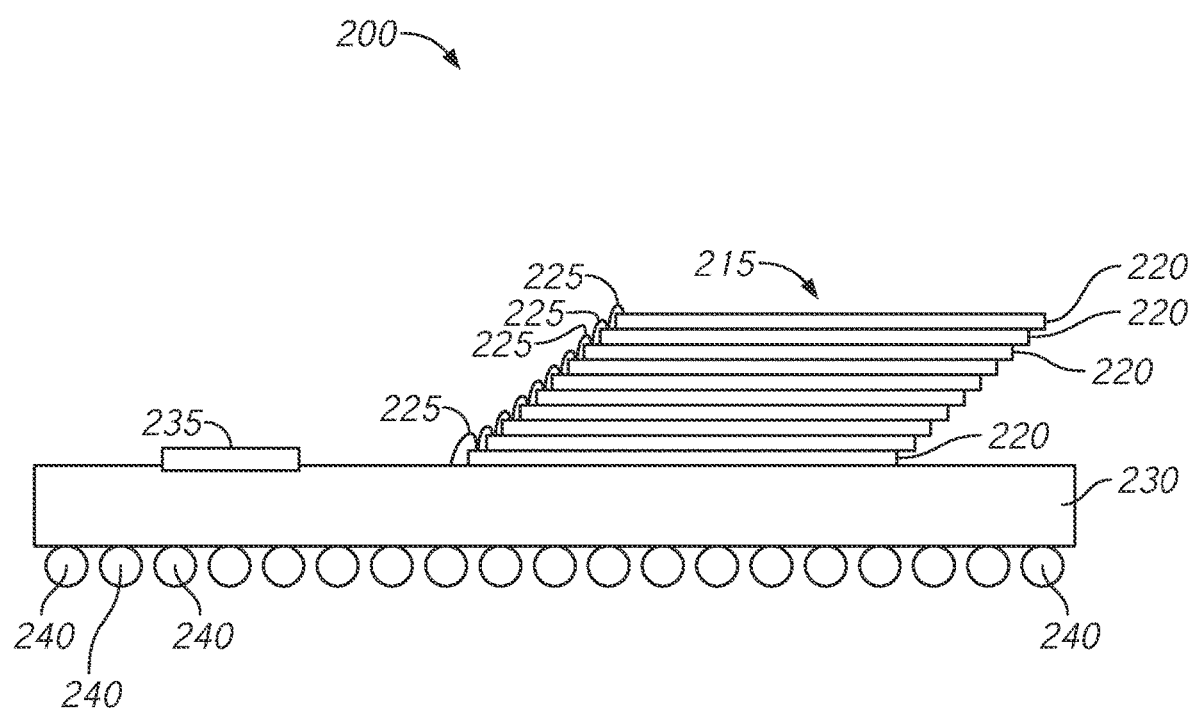
FIG. 2 is a diagram showing a multi-die device according to an embodiment of the disclosure.

FIG. 2 is a diagram showing a multi-die device 200 according to an embodiment of the disclosure. The multi-die device 200 may include a stack 215 of semiconductor devices 220. Embodiments of the disclosure are not limited to the particular number of semiconductor devices 220 included in the stack 215 shown in FIG. 2. In some embodiments of the disclosure, each of the semiconductor devices 220 includes the semiconductor device 110 of FIG. 1.

The semiconductor devices 220 may be stacked in a staggered manner, providing a "shingle-stack" configuration for the stack 215. The semiconductor devices 220 may be attached to one another. In some embodiments of the disclosure, the semiconductor devices 220 are attached to one another by an adhesive epoxy. The semiconductor devices 220 are offset from one another to allow edge regions of the semiconductor devices 220 to be exposed. The exposed edge regions may include bond pads to which conductors 225 may be coupled. In some embodiments of the disclosure, the bond pads of the edge regions may be conductive pads. The bond pads may be coupled to terminals of the respective semiconductor device 220. In some embodiments of the disclosure, the conductors 225 are bond wires.

The stack 215 may be attached to a substrate 230. The stack may be attached to the substrate 230 by an adhesive epoxy in some embodiments of the disclosure. The substrate 230 may include conductive signal lines to route signals along the substrate, for example, to and from the semiconductor devices 220. Other circuits may also be attached to the substrate 230 and coupled to the conductive signals lines as well. As a result, the circuits attached to the substrate 230 may be coupled, for example, to the semiconductors devices 220 through the conductive signal lines of the substrate 230 and conductors coupled to the conductive signal lines and the bond pads of the semiconductor devices. An example circuit 235 attached to the substrate 230 and coupled to the semiconductor devices of the stack 215 is shown in FIG. 2. The circuit 235 may be a register clock driver (RCD) in some embodiments of the disclosure. In such embodiments of the disclosure, the RCD circuit receives and buffers signals provided to the multi-die device 200 and may provide the signals to the semiconductor devices 220. Additional or alternative circuits may be included in the multi-die device 200, and/or the circuit 235 may be other circuits as well without departing from the scope of the disclosure.

Figure 3:
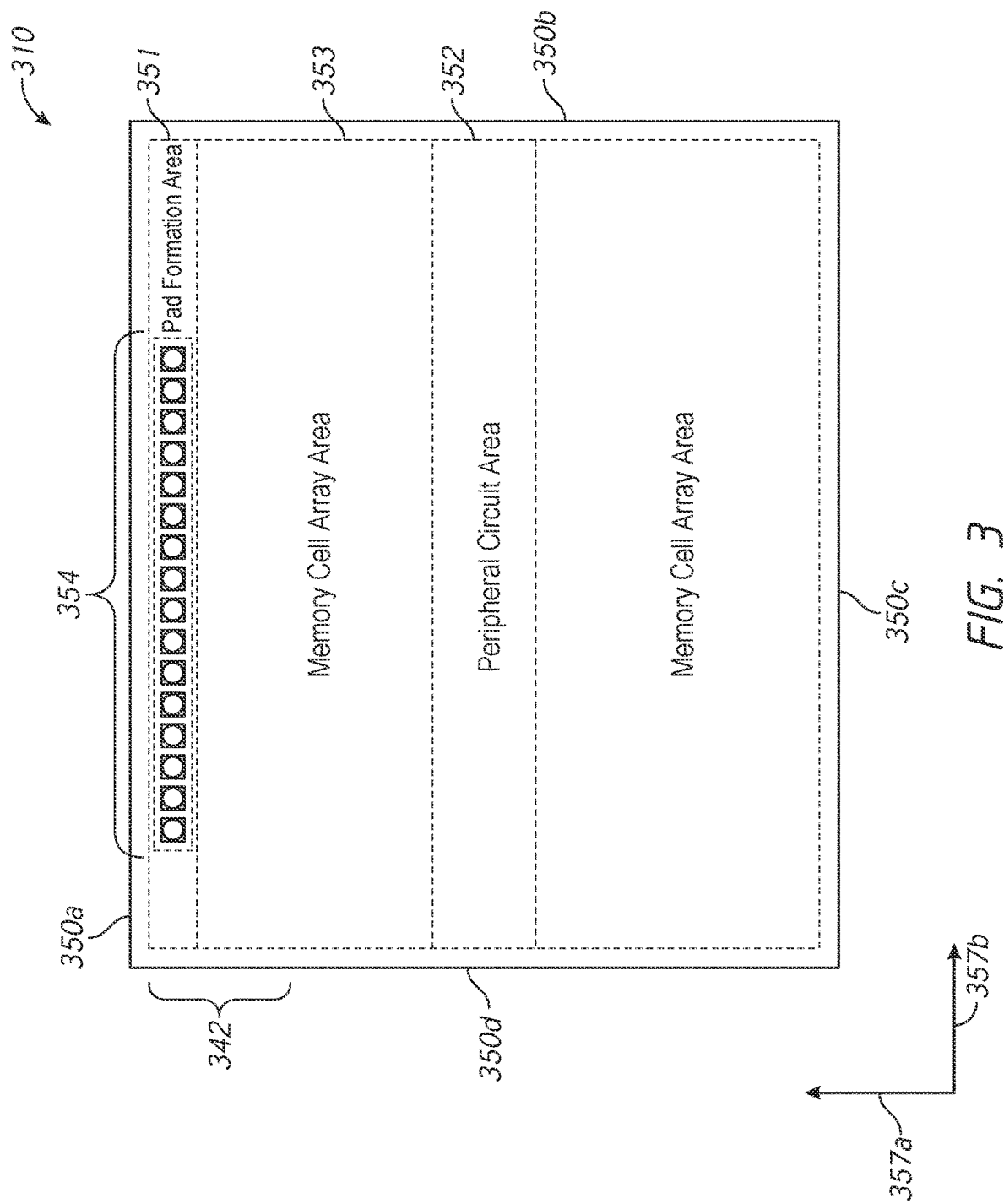
FIG. 3 is a layout diagram of a semiconductor device in accordance with one embodiment of the present disclosure.

FIG. 3 is a layout diagram of a semiconductor device 310 in accordance with one embodiment of the present disclosure. In some embodiments of the disclosure, the semiconductor device 310 includes the semiconductor device 110 of FIG. 1. In some embodiments of the disclosure, the semiconductor device 310 is included in a semiconductor device 220 of stack 215 shown in FIG. 2.

The semiconductor device 310 may have edges 350a, 350b, 350c and 350d, which define ends of the semiconductor device 310. The edges 350b and 350d may extend along a first direction 357a and the edges 350a and 350c may extend along a second direction 357b, which may perpendicular to the first direction 357a. The semiconductor device 310 may include a pad formation area 351, a peripheral circuit area 352, and memory cell array areas 353 that include memory cells, circuits, and signal lines, for example, sense amplifier circuits, address decoder circuits, data input/ output lines, etc. The peripheral circuit area 352 may include various circuits and signal lines for performing various operations of the semiconductor device 310. For example, the peripheral circuit area 352 may include command and address input circuits, address and command decoders, clock circuits, power circuits, and input/output circuits. The peripheral circuit area 352 may also include terminals coupled to various circuits of the semiconductor device (e.g., as previously described for the semiconductor devices 170 of FIG. 1). The terminals may be, for example, die pads of the semiconductor device.

The pad formation area 351 may include a plurality of bond pads 354 disposed along the edge 350a. The plurality of bond pads 354 may be coupled to the terminals (e.g., die pads) of the semiconductor device and represent external terminals of the semiconductor device 310. For example, the plurality of bond pads 354 may include data terminals, command and address terminals, clock terminals, and/or power supply terminals.

Circuits included in the memory cell array area 353 and/or circuits of the peripheral circuit area 352 may be coupled to one or more bond pads 354 included in the pad formation area 351. As previously described, various circuits of the semiconductor device 300 may be coupled to the terminals (e.g., die pads). Conductive structures may be used to couple the terminals to one or more of the bond pads 354. As a result, the circuits coupled to the terminals are also coupled to the bond pads 354. The conductive structures may extend from locations of the terminals included in the memory cell array area 353 and/or the peripheral circuit area 352 to the pad formation area 351. In some embodiments of the disclosure, the conductive structures may include conductive redistribution layers (RDLs).

Figure 4:
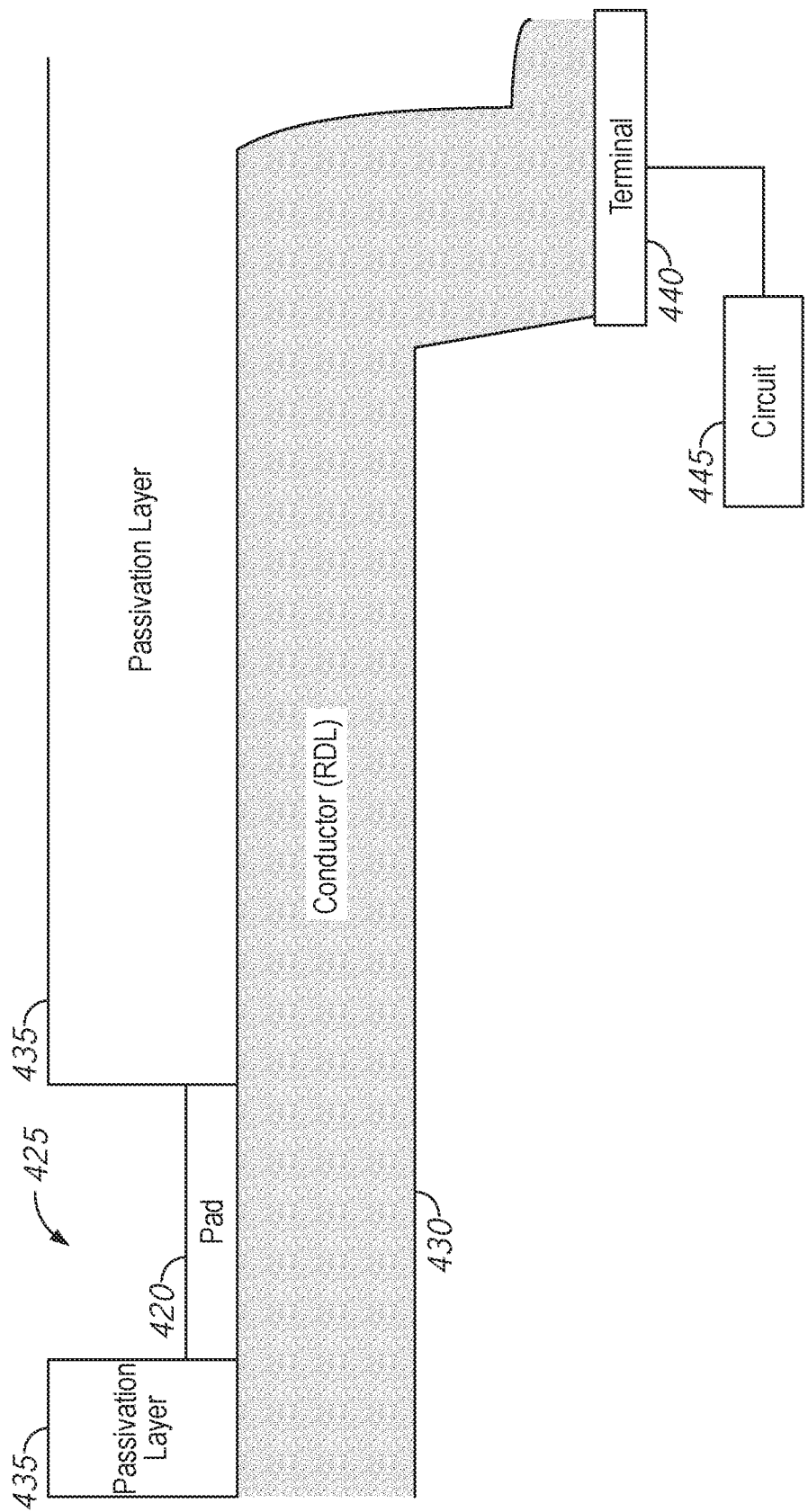
FIG. 4 is a cross sectional view of conductive structures of a semiconductor device according to an embodiment of the disclosure.

FIG. 4 is a cross sectional view of conductive structures of a semiconductor device according to an embodiment of the disclosure. In some embodiments of the disclosure, the conductive structure may be included in the semiconductor device 110 of FIG. 1, the semiconductor devices 220 of the multi-die device 200 of FIG. 2, the semiconductor device 310 of FIG. 3, and/or any semiconductor device according to an embodiment of the disclosure. For example, in some embodiments of the disclosure, the conductive structure may be included in a conductive redistribution layer (RDL) in one or more of the semiconductor devices of FIGS. 1-3.

A conductive structure 430 may couple a terminal 440 of a semiconductor device to a bond pad 420. The terminal 440 may be a die pad in some embodiments of the disclosure. The terminal 440 may be coupled to one or more circuits 445 of the semiconductor device. As a result, the bond pad 420 may be coupled to the circuits 445 through the conductive structure 430 and the terminal 440. The circuits 445 may be, for example, circuits included in a memory cell array area (e.g., memory cell array area 352 of FIG. 3) in some embodiments of the disclosure. The circuits 445 may be, for example, circuits included in a peripheral circuit area (e.g., peripheral circuit area 354 of FIG. 3) in some embodiments of the disclosure. The circuits 445 may be for performing various operations of the semiconductor device. In some embodiments of the disclosure, the circuits 445 may include command and address input circuits, address and command decoders, clock circuits, power circuits, and input/output circuits, as well as other circuits.

The bond pad 420, conductive structure 430, terminal 440, and circuits 445 of the semiconductor device may be formed from semiconductor structures. The semiconductor structures may include conductive layers, conductive vias, insulating interlayers, etc. The terminal 440 may be coupled to the circuits 445 through, for example, metal layers and/or conductive vias. The conductive structure 430 may be disposed on one or more insulating interlayers. As previously described, the conductive structure 430 may be further coupled to the bond pad 420. The conductive structure 430 extends from the terminal 440 to the bond pad 420 so that the bond pad 420 and the circuit terminal 440 may be coupled together. As a result, a circuit 445 coupled to the terminal 440 may be externally accessible though the bond pad 420. The bond pad 420 may be exposed by an opening 425 in a passivation layer 435. In some embodiments of the disclosure, the passivation layer 435 may be a polyimide material.

In some embodiments of the disclosure, the conductive structure 430 may be coupled to the terminal 440 of the semiconductor device (e.g., die pad of the semiconductor device) to provide a bond pad 420 for coupling to a terminal 440 in a different location. For example, the terminal 440 may represent die pads that are generally located in a peripheral circuit region along a center region of the semiconductor device, and the conductive structure 430 may couple the die pads in the center region to bond pads 420 that are located along an edge of the semiconductor device. The bond pads 420 along an edge may be more conveniently located and provide coupling to circuits 445 of the semiconductor device, that is, through the conductive structure 430 and the terminal 440.

Figure 5:
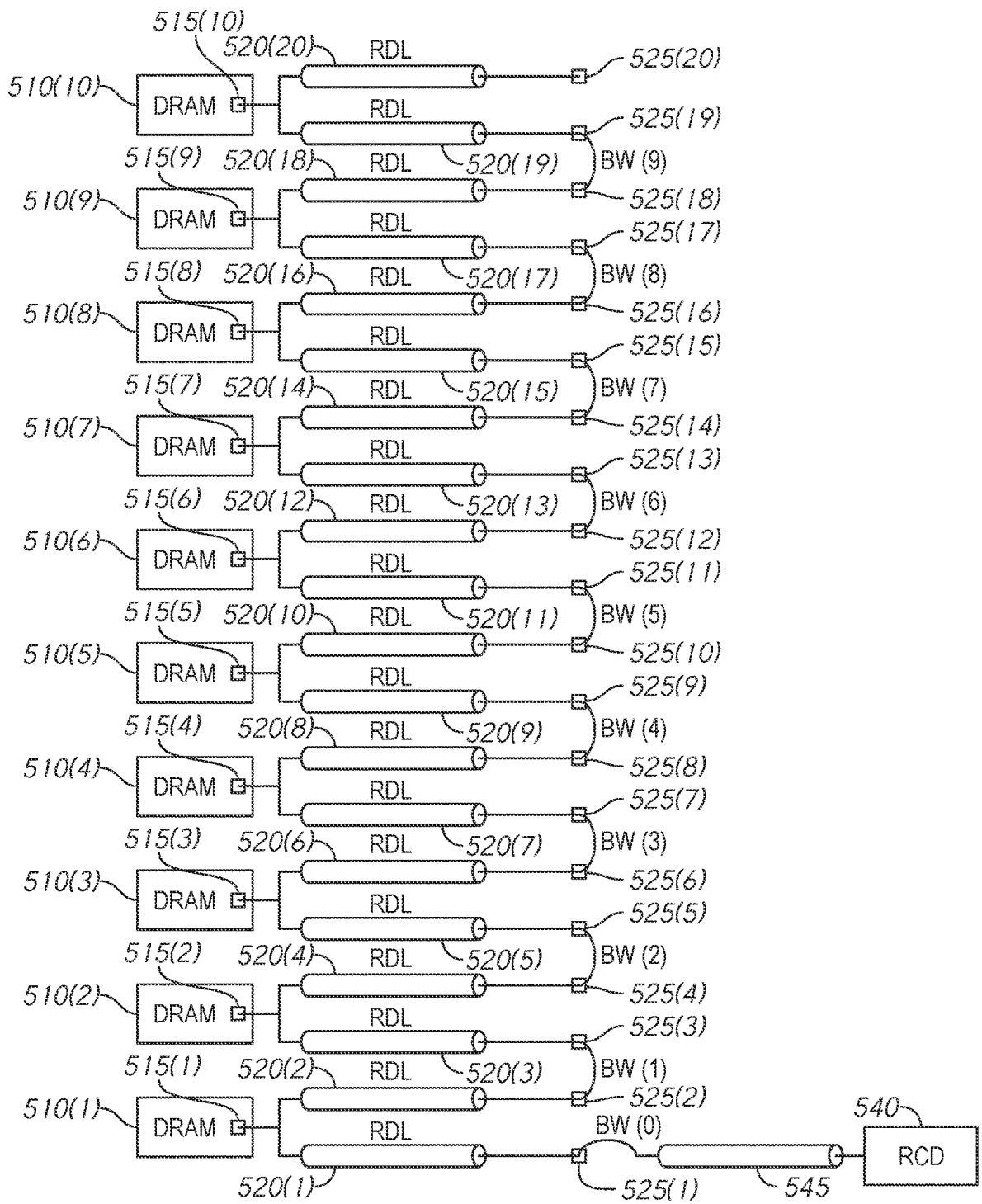
FIG. 5 is a schematic diagram of semiconductor devices coupled together according to an embodiment of the disclosure.

FIG. 5 is a schematic diagram of semiconductor devices coupled together according to an embodiment of the disclosure. The semiconductor devices of FIG. 5 may be included in semiconductor device of a multi-die device (e.g., semiconductor device 220 of multi-die device 200 of FIG. 2) in some embodiments of the disclosure. In some embodiments of the disclosure, each of the semiconductor devices of FIG. 5 may include the semiconductor device 110 of FIG. 1, and may be a memory device.

Semiconductor devices 510(1)-510(10) are coupled together by conductive structures 520(1)-520(20), which may be included in a redistribution layer (RDL). The conductive structures 520 are represented in FIG. 5 as signal lines. The conductive structures may couple die pads 515 (e.g., terminals) of a semiconductor device 510 to bond pads 525 of the respective semiconductor device. Bond pads 525 of each of the semiconductor devices 510 may be coupled together by a respective conductors BW(1)-BW(9). The conductors BW may be bond wires in some embodiments of the disclosure.

A circuit 540 may be coupled to the semiconductor devices 510. For example, the circuit 540 is coupled to the semiconductor device 510(1) through conductive signal line 545 and conductor BW(0), and further through bond pad 525(1) and conductive structure 520(1), which is coupled to the die pad 515 of semiconductor device 510(1). In some embodiments of the disclosure, the circuit 540 may be a register clock driver (RCD) attached to a substrate that includes conductive signal line 545, and the conductor BW(0) may be a bond wire. For example, in some embodiments of the disclosure, the circuit 540 and conductive signal line 545 may represent the circuit 235 and a conductive signal line included in the substrate 230, and the semiconductor device 510(1) may represent a semiconductor device 220 in the stack 215 of FIG. 2.

In some embodiments of the disclosure, two bond pads 525 and two conductive structures 520 may be coupled to one die pad 515 of the semiconductor device. For example, the die pad 515(1) of semiconductor device 510(1) is coupled to bond pads 525(1) and 525(2) by conductive structures 520(1) and 520(2), respectively. Similarly, the die pad 515(2) of semiconductor device 510(2) is coupled to bond pads 525(3) and 525(4) by conductive structures 520(3) and 520(4), respectively; the die pad 515(3) of semiconductor device 510(3) is coupled to bond pads 525(5) and 525(6) by conductive structures 520(5) and 520(6), respectively; and so on.

In some embodiments of the disclosure, the two conductive structures 520 coupled to a die pad 515 of a semiconductor device 510 may represent a "U" shaped RDL structure. The U-shaped RDL structure may include two leg portions. Each of the leg portions have a first end coupled to the first end of the other leg portion, and each of the leg portions have a second end that is opposite of the first end. The second ends of each leg portion may be coupled to a respective bond pad. The first ends of the leg portions that couple together may represent a closed end of the RDL structure, and the second ends of the two leg portions opposite of the first ends may represent an open end of the RDL structure. For example, with reference to FIG. 5, the conductive structures 520(1) and 520(2) represent leg portions with the first ends coupled together nearest the die pad 515 of the semiconductor device 510(1) of an RDL structure. The second ends of the leg portions are nearest the bond pads 525(1) and 525(2). A die pad of a semiconductor device may be coupled to any portion of the RDL structure. In some embodiments of the disclosure, a die pad of a semiconductor device may be coupled to the closed end of the RDL structure.

The semiconductor devices 510 may be coupled together in a daisy chain manner by RDL structures (e.g., the conductive structures 520), bond pads 525, and conductors BW. For example, the semiconductor devices 510(1)-510(3) may be coupled together in a daisy chain starting from the bond pad 525(1) as follows: bond pad 525(1) coupled to die pad 515(1) of semiconductor device 510(1) by conductive structure 520(1); die pad 515(1) coupled to the bond pad 525(2) by conductive structure 520(2); bond pad 525(2) coupled to bond pad 525(3) by conductor BW(1); bond pad 525(3) coupled to die pad 515(2) of semiconductor device 510(2) by conductive structure 520(3); die pad 515(2) coupled to bond pad 525(4) by conductive structure 520(4); bond pad 525(4) coupled to bond pad 525(5) by conductor BW(2); bond pad 525(5) coupled to die pad 515(3) of semiconductor device 510(3) by conductive structure 520(5). Similarly, the semiconductor devices 510(4)-510(10) are also coupled in a daisy chain manner to each other and to the semiconductor devices 510(1)-510(3).

A daisy chain coupling may present a lower load to a circuit coupled to the semiconductor devices 510, for example, the circuit 540 (e.g., an RCD), in comparison to a parallel coupling of the semiconductor devices 510. For example, with parallel coupling of the stacked devices, the load presented to the circuit may include the loads of all the devices in the stack. In contrast, with a daisy chain (e.g., serial) coupling of the stacked devices, the load presented to the circuit results from the distributed loading of the first circuit in the chain of semiconductor die followed by each subsequent circuit. This electrical distribution results in an effective reduction in the observed load at higher frequencies than the parallel configuration. U-turn RDLs may be used to implement a true daisy chain. Where U-turn RDLs are not used, there may be long electrical stubs (from bond pad to die pad) which cause reflections and degrade signal integrity. By using U-turn RDLs, however, the "legs" of the RDL no longer form stubs, but are one serial path with no parallel segments. Such an arrangement may be beneficial to signal integrity. Thus, it may be advantageous to have a daisy chain coupling, such as that provided by one or more embodiments of the disclosure.

The semiconductor devices 510 are shown in FIG. 5 having one die pad 515 (e.g., terminal). However, the semiconductor devices 510 may have additional die pads. The additional die pads may also be coupled to bond pads by conductive structures, and the bond pads coupled by conductors, for example, in a daisy chain manner. In some embodiments of the disclosure, some of the die pads of each semiconductor device are not coupled in a daisy chain manner, whereas others of the die pads of the semiconductor device are coupled in a daisy chain manner with the other semiconductor devices. For example, some of the die pads of each semiconductor device may be coupled in parallel to corresponding die pads of another one of the semiconductor devices, and some of the die pads of each semiconductor device may be coupled in a daisy chain (e.g., coupled in serial) to corresponding die pads of another one of the semiconductor devices. In some embodiments of the disclosure, data terminals and/or command and address terminals of the semiconductor devices may be coupled in a daisy chain manner.

Figure 6:
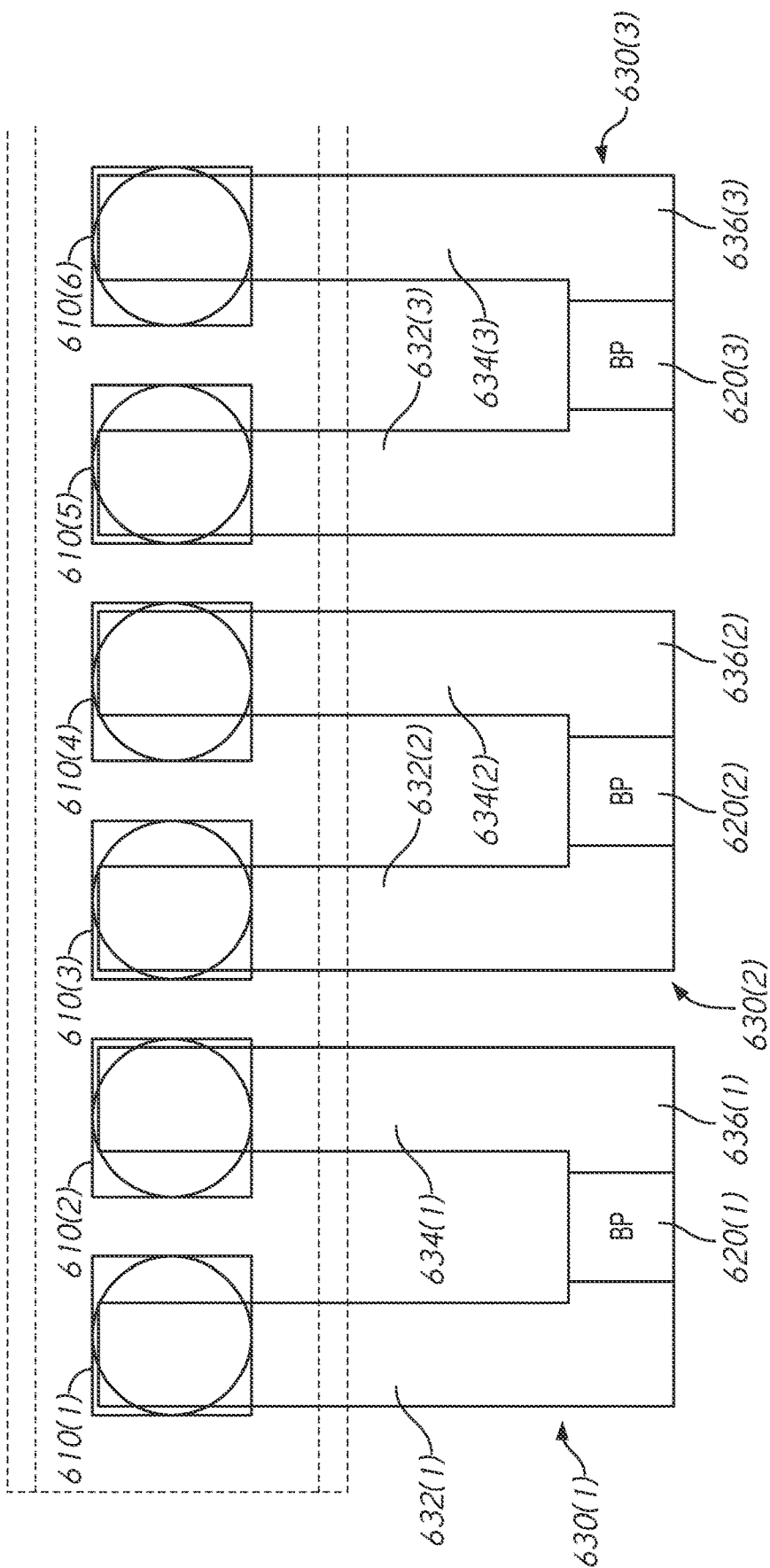
FIG. 6 is a diagram showing RDL structures coupling terminals of a semiconductor device to bond pads according to an embodiment of the disclosure.

FIG. 6 is a diagram showing RDL structures coupling terminals of a semiconductor device to bond pads according to an embodiment of the disclosure. In some embodiments of the disclosure, the RDL structures may be included in any of the semiconductor devices previously described with reference to FIGS. 1-5. For example, the RDL structures may be included in the semiconductor device 310 of FIG. 3 to couple bond pads 354 to terminals included in the peripheral circuit area.

Bond pads 610(1)-610(6) are coupled to at least one of the die pads 620(1)-620(3) through RDL structures 630(1)-630(3). For example, at least two bond pads 610 are coupled to at least one die pad 620 by a respective RDL structure 630. In the example of FIG. 6, bond pads 610(1) and 610(2) are coupled to the die pad 620(1) by RDL structure 630(1); bond pads 610(3) and 610(4) are coupled to the die pad 620(2) by RDL structure 630(2); and bond pads 610(5) and 610(6) are coupled to the die pad 620(3) by RDL structure 630(3). In some embodiments of the disclosure, the RDL structures 630 may have a "U" shape that couples two bond pads 610 to one die pad 620.

The RDL structure 630(1) may include a first portion 632(1) that extends from a bond pad 610(1)(e.g., a first bond pad) to a die pad 620(1), and may further include a second portion 634(1) that extends from a bond pad 610(2) (e.g., a second bond pad) to the die pad 620(1). The portion 632(1) may include a conductive structure and the portion 634(1) may include a conductive structure. The each of the conductive structures may be included in an RDL in some embodiments of the disclosure. The first portion 632(1) and the second portion 634(1) are coupled to the die pad 620(1). In some embodiments of the disclosure, the first and second portions 632(1) and 634(1) may be coupled to the die pad 620(1) by a third portion that is coupled to the first and second portions 632(1) and 634(1). For example, in FIG. 6, a third portion 636(1) is coupled the first and second portions 632(1) and 634(1), and coupled to the die pad 620(1). The third portion 636(3) may be included in the RDL structure 630(1). In some embodiments of the disclosure, the first and second portions 632(1) and 634(1) are coupled to the die pad 620 without a third portion. For example, the first and second portions may be shaped to provide coupling between first and second bond pads to a same die pad 620 without a third portion.

The RDL structures 630(2) and 630(3) may include respective first and second portions as previously described for the RDL structure 630(1), which are coupled to a respective die pad 620(2) and 620(3). Likewise, the RDL structures 630(2) and 630(3) may include a respective third portion as previously described for RDL structure 630(1) in some embodiments of the disclosure.

The RDL structures 630 may be formed from conductive materials of one or more conductive layers. For example, in some embodiments of the disclosure, the first and second portions of the RDL structures 630 may be formed from a same conductive layer. The third portion may be formed from the same conductive layer. In some embodiments of the disclosure, one or more of the portions of the RDL layer may be formed from a different conductive layer from the other portions. The portions themselves may be formed from one or more conductive layers. The conductive structures may be formed from a conductive layer that is below the bond pads 610 and above the die pad 620.

The RDL structures 630 have been provided by way of example and embodiments of the disclosure are not limited to the particular example of FIG. 6.

Figure 7:
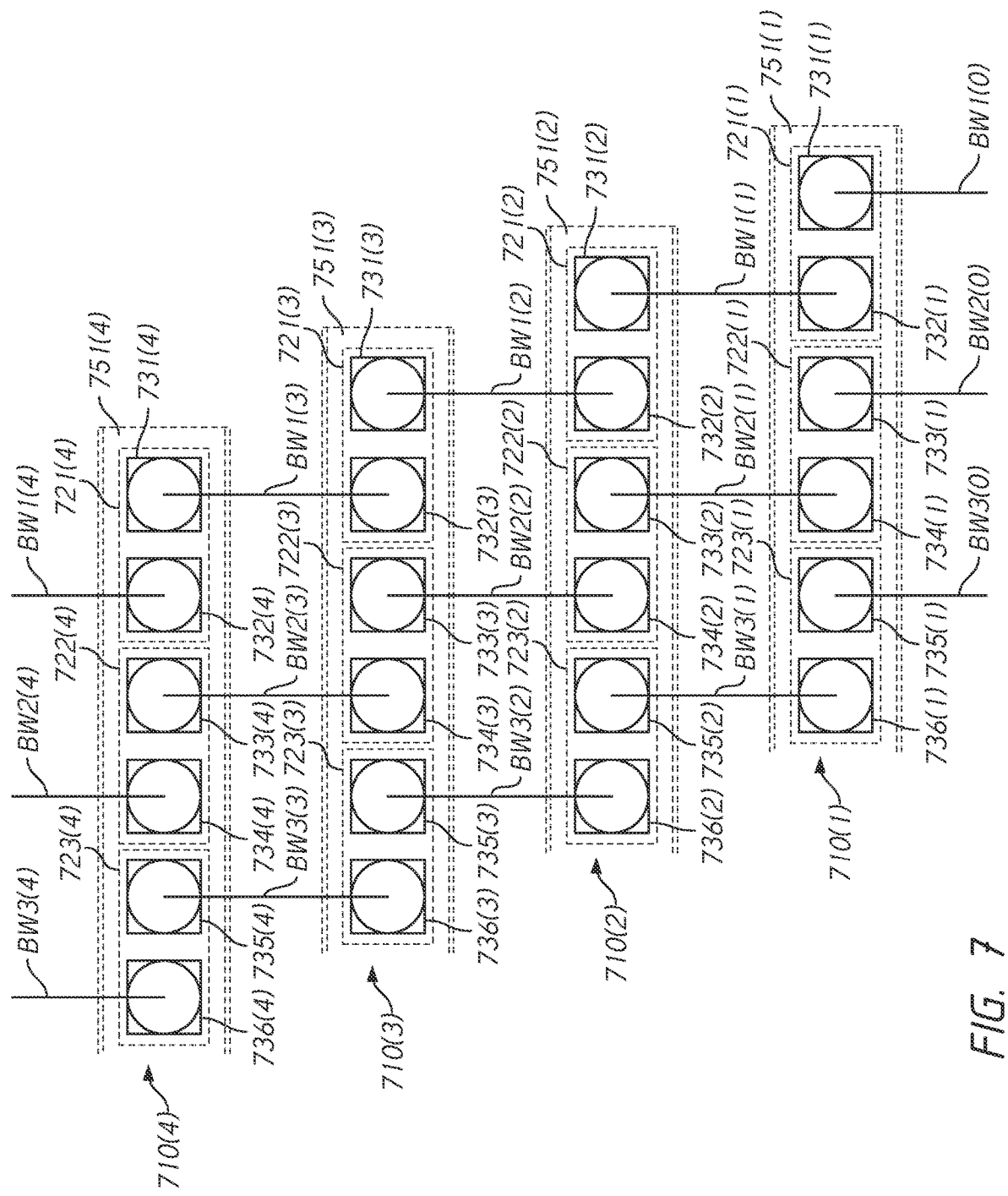
FIG. 7 is a plan diagram of bond pads of semiconductor devices coupled together according to an embodiments of the disclosure.

FIG. 7 is a plan diagram of bond pads of semiconductor devices coupled together according to an embodiment of the disclosure. The semiconductor devices may be included in a multi-die device (e.g., multi-die device 200 of FIG. 2) in some embodiments of the disclosure.

The bond pads 731-736 may be included in a pad formation area of respective semiconductor device 710(1)-710(4). Pairs of the bond pads may be coupled to a respective die pad of the semiconductor device. For example, with reference to the bond pads 731(1)-736(1) of the semiconductor device 710(1), the bond pads 731(1) and 732(1) of pair of bond pads 721(1) may be coupled to a same die pad of the semiconductor device 710(1). Similarly, bond pads 733(1) and 734(1) of pair of bond pads 722(1) may both be coupled to another die pad of the semiconductor device 710(1), and bond pads 735(1) and 736(1) of pair of bond pads 723(1) may both be coupled to yet another die pad of the semiconductor device 710(1). Pairs of bond pads of the other semiconductor devices 710(2)-710(4) may be coupled to a respective common die pad as well.

Pairs of bond pads may be coupled by conductive structures that extend from the respective bond pads to the same die pad. For example, the bond pads 731(1) and 732(1) may be coupled by conductive structures that extend from respective bond pads 731(1) and 732(1) to the same die pad. Similarly, the bond pads 733(1) and 734(1) may be coupled by conductive structures that extend from respective bond pads 733(1) and 734(1) to the same die pad. The conductive structures may be included in an RDL structure. In some embodiments of the disclosure, a U-shaped RDL structure may be used to couple the bond pads to the same die pad. For example, conductive structures and RDL structures of FIG. 5 may be used in some embodiments of the disclosure. Conductive structures and RDL structures of FIG. 6 may be used in some embodiments of the disclosure.

Die pads of the semiconductor devices 710(1)-710(4) may be coupled together in a daisy chain manner though the pairs of bond pads coupled to respective die pads. For example, assume die pad "A" is a die pad of semiconductor device 710(1) coupled to the pair of bond pads 721(1); die pad "B" is a die pad of semiconductor device 710(2) coupled to the pair of bond pads 721(2); die pad "C" is a die pad of semiconductor device 710(3) coupled to the pair of bond pads 721(3); and die pad "D" is a die pad of semiconductor device 710(4) coupled to the pair of bond pads 721(4). Die pad A may be coupled to die pad B by coupling bond pad 732(1) to bond pad 731(2) by a conductor BW1(1); die pad B may be coupled to die pad C by coupling bond pad 732(2) to bond pad 731(3) by a conductor BW1(2); and die pad C may be coupled to die pad D by coupling bond pad 732(3) to bond pad 731(4) by a conductor BW1(3). As a result, die pads A, B, C, and D may be coupled in a daisy chain manner.

The daisy chain of die pads A, B, C, and D may be further coupled to a circuit (e.g., an RCD attached to a substrate) by conductor BW1(0). For example, bond pad 731(1) may be coupled to a conductive signal line by BW1(0), and the conductive signal line may in turn be coupled to the circuit.

The daisy chain of die pads A, B, C, and D may also be further coupled to die pads of other semiconductor devices (e.g., additional semiconductor devices in a multi-die stack) by conductor BW1(4). For example, bond pad 732(4) may be coupled to a bond pad of another semiconductor device by BW1(4), and the bond pad may in turn be coupled to the die pad of the other semiconductor device.

The other die pads of semiconductor devices 710(1)-710(4) may be coupled together in a similar daisy chain manner. For example, die pads coupled to the pairs of bond pads 722(1), 722(2), 722(3), and 722(4) may be coupled in a daisy chain manner as follows: bond pad 734(1) coupled to bond pad 733(2) by conductor BW2(1); bond pad 734(2) coupled to bond pad 733(3) by conductor BW2(2); bond pad 734(3) coupled to bond pad 733(4) by conductor BW2(3). Similarly, die pads coupled to the pairs of bond pads 723(1), 723(2), 723(3), and 723(4) may be coupled in a daisy chain manner as follows: bond pad 736(1) coupled to bond pad 735(2) by conductor BW3(1); bond pad 736(2) coupled to bond pad 735(3) by conductor BW3(2); bond pad 736(3) coupled to bond pad 735(4) by conductor BW3(3). Conductors BW2(0) and BW2(4) coupled to bond pads 733(1) and 734(4), respectively, may be used to couple the daisy chained die pads to a circuit (e.g., an RCD) and other semiconductor devices (e.g., in a multi-die stack). Likewise, conductors BW3(0) and BW3(4) coupled to bond pads 735(1) and 736(4), respectively, may be used to couple the daisy chained die pads to a circuit (e.g., an RCD) and other semiconductor devices (e.g., in a multi-die stack).

In the example of FIG. 7, six bond pads 731-736 from each of the semiconductor devices 710(1)-710(4) are shown. The six bond pads 731-736 are provided by way of example, and each of the semiconductor devices 710(1)-710(4) may include a greater or fewer number of bond pads without departing from the scope of the present disclosure. Additionally, four semiconductor devices 710(1)-710(4) are shown in FIG. 7. However, a greater or fewer number of semiconductor devices may be coupled together without departing from the scope of the present disclosure.

Certain details have been described to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a plurality of semiconductor devices including first, second, and third semiconductor devices, each of the plurality of semiconductor devices including a die pad coupled to at least one circuit of the respective semiconductor device, and further including a redistribution layer structure coupled to the die pad and further coupled to first and second bond pads, wherein the second bond pad of the first semiconductor device is coupled to the first bond pad of the second semiconductor device, and the second bond pad of the second semiconductor device is coupled to the first bond pad of the third semiconductor device.

2. The apparatus of claim 1 wherein the plurality of semiconductor devices are included in a stack of semiconductor devices.

3. The apparatus of claim 2 wherein the plurality of semiconductor devices are stacked in a staggered manner and an edge region of each of the semiconductor devices of the plurality is exposed, wherein the respective first and second bond pads are located at the edge regions of the plurality of semiconductor devices.

4. The apparatus of claim 1 wherein the second bond pad of the first semiconductor device is coupled to the first bond pad of the second semiconductor device by a bond wire, and the second bond pad of the second semiconductor device is coupled to the first bond pad of the third semiconductor device by another bond wire.

5. The apparatus of claim 1 wherein the redistribution layer structure of each of the plurality of semiconductor devices is U-shaped.

6. The apparatus of claim 1 wherein the redistribution layer structure of each of the plurality of semiconductor devices includes a first portion extending between the die pad and the first bond pad and further includes a second portion extending between the die pad and the second bond pad.

7. The apparatus of claim 6 wherein the redistribution layer structure of each of the plurality of semiconductor devices further includes a third portion coupled to the first and second portions and further coupled to the die pad.

8. The apparatus of claim 1, further comprising:
an external circuit coupled to the first bond pad of the first semiconductor device; and
a substrate including conductive signal lines, wherein the plurality of semiconductor devices and the external circuit are attached to the substrate and the external circuit is coupled to the first bond pad of the first semiconductor device by the conductive signal lines.

9. The apparatus of claim 1 wherein the respective die pad of each of the plurality of semiconductor devices is included in a peripheral circuit area that is located along a center region of the respective semiconductor device.

10. The apparatus of claim 1 wherein the respective die pads of each of the plurality of semiconductor devices are coupled together in a daisy chain through the bond pads and redistribution layer structures.

11. A multi-die device, comprising:
a substrate including a conductive signal line;
a stack of semiconductor devices attached to the substrate, each of the semiconductor devices of the stack including a terminal and a redistribution layer structure coupled to the terminal, wherein the terminals of the semiconductor devices of the stack are coupled together in a daisy chain manner through the redistribution layer structures, wherein each of the semiconductor devices further includes first and second bond pads, and wherein the first bond pad is coupled to a first portion of the redistribution layer structure and the second bond pad is coupled to a second portion of the redistribution layer structure; and
a circuit attached to the substrate and coupled to a first semiconductor device of the stack of semiconductor devices by the conductive signal line.

12. The multi-die device of claim 11 wherein the first and second bond pads of each semiconductor device are located at an edge region and the terminal is included in a peripheral circuit area that is located along a center region of the respective semiconductor device.

13. The multi-die device of claim 11 wherein the one of the first and second bond pads of a semiconductor device of the stack is coupled to one of the first and second bond pads of another semiconductor device of the stack by a bond wire.

14. The multi-die device of claim 11 wherein the first portion includes a first conductive structure formed from a conductive layer different than the first bond pad and the terminal and wherein the second portion includes a second conductive structure formed from the same conductive layer.

15. The multi-die device of claim 11 wherein the circuit attached to the substrate comprises a register clock driver (RCD) circuit.

16. The multi-die device of claim 11 wherein the terminal comprises a data terminal or a command address terminal.

17. A multi-die device, comprising:
a substrate including a conductive signal line;
a stack of semiconductor devices attached to the substrate, each of the semiconductor devices of the stack including a terminal and a redistribution layer structure coupled to the terminal, wherein the redistribution layer structure comprises a U-shaped redistribution layer structure, and wherein the terminals of the semiconductor devices of the stack are coupled together in a daisy chain manner through the redistribution layer structures; and
a circuit attached to the substrate and coupled to a first semiconductor device of the stack of semiconductor devices by the conductive signal line.

18. A method, comprising:
coupling a bond pad of a first semiconductor device to a first U-shaped conductive structure;
coupling a bond pad of a second semiconductor device to a second U-shaped conductive structure;
coupling a bond pad of a third semiconductor device to a third U-shaped conductive structure;
coupling a second portion of the first U-shaped conductive structure to a first portion of the second U-shaped conductive structure; and
coupling a second portion of the second U-shaped conductive structure to a first portion of the third U-shaped conductive structure,
wherein a first portion of the first U-shaped conductive structure is coupled to a circuit and wherein a second portion of the third U-shaped conductive structure is coupled to a fourth semiconductor device.

* * * * *